United States Patent
McCullough

(10) Patent No.: US 6,680,015 B2
(45) Date of Patent: Jan. 20, 2004

(54) METHOD OF MANUFACTURING A HEAT SINK ASSEMBLY WITH OVERMOLDED CARBON MATRIX

(75) Inventor: Kevin A. McCullough, Warwick, RI (US)

(73) Assignee: Cool Options, Inc., Warwick, RI (US)

( * ) Notice: Subject to any disclaimer, the term of this patent is extended or adjusted under 35 U.S.C. 154(b) by 88 days.

(21) Appl. No.: 09/774,521

(22) Filed: Jan. 31, 2001

(65) Prior Publication Data

US 2001/0024724 A1 Sep. 27, 2001

Related U.S. Application Data

(60) Provisional application No. 60/178,949, filed on Feb. 1, 2000.

(51) Int. Cl.[7] .............................................. B29C 45/14
(52) U.S. Cl. ............... 264/105; 264/271.1; 264/272.15; 257/720
(58) Field of Search ................ 264/272.15, 272.17, 264/105, 104, 259, 271.1, 279, 279.1; 438/122; 257/706, 717, 712, 720

(56) References Cited

U.S. PATENT DOCUMENTS

| | | | |
|---|---|---|---|
| 3,398,233 A | 8/1968 | Lizasoain et al. ............ 174/110 |
| 3,564,109 A | 2/1971 | Ruechardt | |
| 3,673,121 A | 6/1972 | Meyer ........................ 252/511 |
| T904,012 I4 | 11/1972 | Staniland .................... 252/503 |
| 3,708,387 A | 1/1973 | Turner et al. ............... 161/168 |
| 4,098,945 A | 7/1978 | Ochmke .................... 428/327 |
| 4,307,147 A | 12/1981 | Ohishi et al. ............... 428/268 |
| 4,367,745 A | 1/1983 | Welage .................. 128/303.13 |
| 4,496,475 A | 1/1985 | Abrams ...................... 252/514 |
| 4,568,592 A | 2/1986 | Kawaguchi et al. ........ 428/107 |
| 4,664,971 A | 5/1987 | Soens ........................ 427/288 |
| 4,689,250 A | 8/1987 | Quella et al. ............... 427/216 |
| 4,739,449 A | 4/1988 | Kaufman | |
| 4,816,184 A | 3/1989 | Fukuda et al. .............. 252/511 |
| 4,831,495 A | 5/1989 | Harding | |
| 5,011,870 A | 4/1991 | Peterson .................... 523/220 |
| 5,011,872 A | 4/1991 | Latham et al. ............. 523/440 |
| 5,021,494 A | 6/1991 | Toya .......................... 524/404 |
| 5,098,610 A | 3/1992 | Okamura et al. ........... 252/511 |
| 5,098,611 A | 3/1992 | Honda et al. ............... 252/518 |
| 5,106,540 A | 4/1992 | Barma et al. ............... 252/511 |
| 5,155,579 A | 10/1992 | AuYeung | |
| 5,175,668 A | 12/1992 | Kendel | |
| 5,180,513 A | 1/1993 | Durand .................... 252/62.55 |
| 5,183,594 A | 2/1993 | Yoshinaka et al. ......... 252/518 |
| 5,194,935 A | 3/1993 | Kitano et al. | |
| 5,213,715 A | 5/1993 | Patterson et al. ........... 252/518 |
| 5,225,110 A | 7/1993 | Kathigamanathan ........ 252/512 |
| 5,286,416 A | 2/1994 | Teichmann et al. ......... 252/512 |
| 5,296,740 A | * 3/1994 | Sono et al. ................. 257/702 |
| 5,302,456 A | 4/1994 | Matsui ....................... 428/407 |
| 5,315,480 A | 5/1994 | Samarov et al. | |
| 5,334,330 A | 8/1994 | Rowlette .................... 252/512 |
| 5,371,404 A | 12/1994 | Juskey et al. | |
| 5,373,046 A | 12/1994 | Okamura et al. ........... 524/496 |
| 5,379,186 A | 1/1995 | Gold et al. | |
| 5,379,187 A | 1/1995 | Lee et al. | |

(List continued on next page.)

FOREIGN PATENT DOCUMENTS

JP          402164054 A        6/1990

*Primary Examiner*—Jeff H. Aftergut
*Assistant Examiner*—Barbara J Musser
(74) *Attorney, Agent, or Firm*—Barlow, Josephs & Holmes, Ltd.

(57) ABSTRACT

A net-shape molded heat sink is provided which includes a thermally conductive main body and a number of thermally conductive fins integrally connected to and emanating from the main body. The heat sink is formed by overmolding a carbon-carbon matrix core plate with a thermally conductive polymer composition that is filled with thermally conductive filler material. The molded heat sink is freely convecting through the part which makes it more efficient and has an optimal thermal configuration.

2 Claims, 1 Drawing Sheet

U.S. PATENT DOCUMENTS

| | | | |
|---|---|---|---|
| 5,397,608 A | 3/1995 | Soens | 428/34.5 |
| 5,445,308 A | 8/1995 | Nelson et al. | 228/121 |
| 5,461,201 A | 10/1995 | Schonberger et al. | |
| 5,490,319 A | 2/1996 | Nakamura et al. | 29/596 |
| 5,522,962 A | 6/1996 | Koskenmaki et al. | 156/272.4 |
| 5,536,568 A | 7/1996 | Teruo | 428/327 |
| 5,580,493 A | 12/1996 | Chu et al. | 252/511 |
| 5,669,381 A | 9/1997 | Hyatt | 428/402 |
| 5,672,414 A | 9/1997 | Okamoto et al. | |
| 5,681,883 A | 10/1997 | Hill et al. | 524/404 |
| 5,770,305 A | 6/1998 | Terasaka | 428/328 |
| 5,781,412 A | 7/1998 | de Sorgo | |
| 5,812,374 A | 9/1998 | Shuff | |
| 5,825,608 A | 10/1998 | Duva et al. | |
| 5,834,337 A | 11/1998 | Unger et al. | 438/122 |
| 5,851,644 A | 12/1998 | McArdle et al. | 428/213 |
| 5,863,467 A | 1/1999 | Mariner et al. | 252/511 |
| 5,901,041 A | 5/1999 | Davies et al. | |
| 5,930,117 A | 7/1999 | Gengel | |
| 5,945,217 A | 8/1999 | Hanrahan | 428/403 |
| 5,986,885 A | 11/1999 | Wyland | |
| 6,048,919 A | 4/2000 | McCullough | 524/404 |
| 6,162,849 A * | 12/2000 | Zhuo et al. | 524/404 |
| 6,413,353 B2 * | 7/2002 | Pompeo et al. | 156/307.3 |
| 6,585,925 B2 * | 7/2003 | Benefield | 264/255 |

* cited by examiner

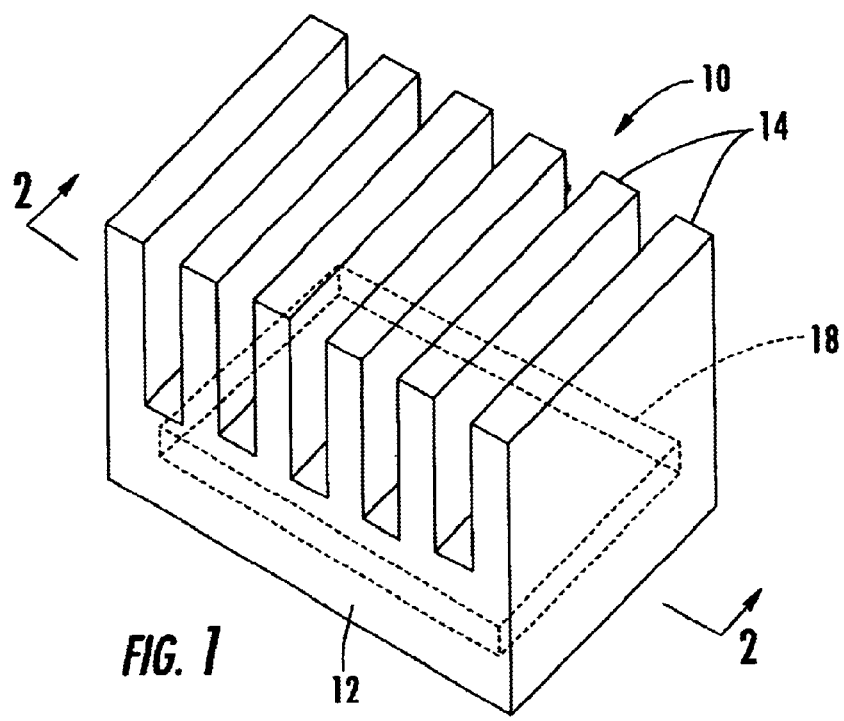
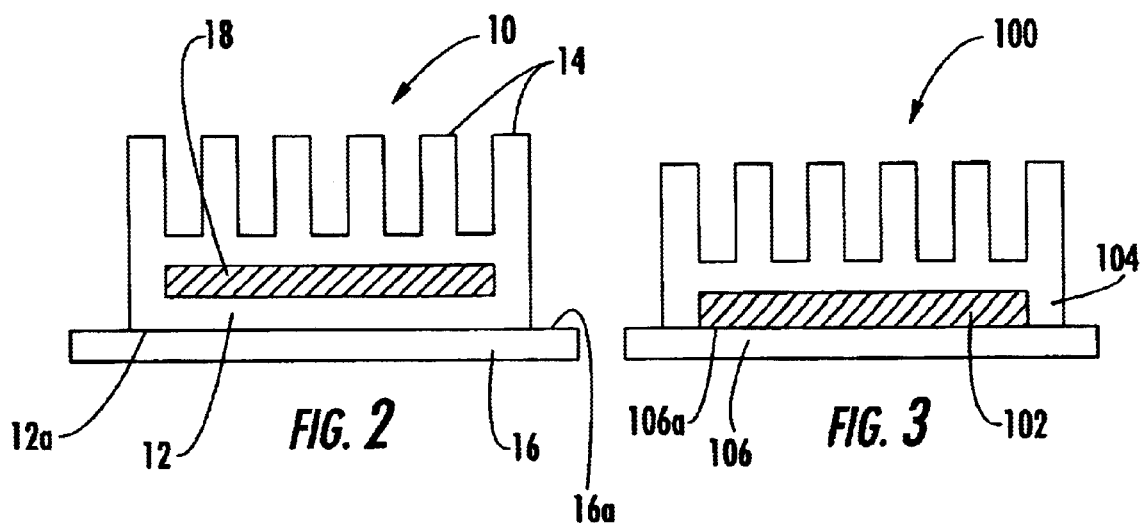

METHOD OF MANUFACTURING A HEAT SINK ASSEMBLY WITH OVERMOLDED CARBON MATRIX

This application claims the benefit of provisional application 60/178,949 filed on Feb. 1, 2000.

BACKGROUND OF THE INVENTION

The present invention relates generally to the cooling of heat generating surfaces and objects. More specifically, the present invention relates to apparatuses for dissipating heat generated by such objects. In addition, the present invention relates to cooling of heat generating objects by use of composite materials and devices without the use of external fans to assist in cooling.

In industry, there are various parts and components that generate heat during operation. For example, in the electronics and computer industries, it is well known that computer components generate heat during operation. Various types of electronic device packages and integrated circuit chips, such as the PENTIUM central processing unit chip (CPU) manufactured by Intel Corporation and RAM (random access memory) chips are such devices that generate heat. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

There are a number of prior art methods to cool heat generating components and objects to avoid device failure and overheating, as discussed above. A block heat sink or heat spreader is commonly placed into communication with the heat generating surface of the object to dissipate the heat therefrom. Such a heat sink typically includes a base member with a number of individual cooling members, such as fins, posts or pins, to assist in the dissipation of heat. The geometry of the cooling members is designed to improve the surface area of the heat sink with the ambient air for optimal heat dissipation. The use of such fins, posts of pins in an optimal geometrical configuration greatly enhances heat dissipation compared to devices with no such additional cooling members, such as a flat heat spreader.

To further enhance air flow and resultant heat dissipation, fans and devices have been used, either internally or externally. However, these external devices consume power and have numerous moving parts. As a result, heat sink assemblies with active devices are subject to failure and are much less reliable than a device which is solely passive in nature.

It has been discovered that more efficient cooling of electronics can be obtained through the use of passive devices which require no external power source and contain no moving parts. It is very common in the electronics industry to have many electronic devices on a single circuit board, such as a motherboard, modem, or "processor card" such as the Celeron board manufactured by Intel Corporation. For example, video cards, which are capable of processing millions of polygons per second, are also susceptible to overheating and need efficient and effective cooling as do the CPUs discussed above. Video cards typically have at least one chip thereon that runs extremely hot to necessitate a video card cooling system.

There have been prior art attempts to provide effective and efficient cooling to microprocessors, electronic components, other heat generating components, and the like. The devices of the prior art are simply the technology previously used for CPUs and other heat generating components. In particular, machined block heat sinks of metal have been typically used for cooling CPU chips, such as the Pentium processor, as described above. These block heat sinks have been modified in size to match the size of the semiconductor device package to be cooled. Since the prior art heat sinks are made of metal, it must be machined to achieve the desired fin configuration. Since the machining process is limited, the geometry of the fin configuration of a machined heat sink is inherently limited.

In the heat sink industries, it has been well known to employ metallic materials for thermal conductivity applications, such as heat dissipation for cooling semiconductor device packages. For these applications, such as heat sinks, the metallic material typically is tooled or machined from bulk metals into the desired configuration. However, such metallic conductive articles are typically very heavy, costly to machine and are susceptible to corrosion. Further, the geometries of machined metallic heat dissipating articles are very limited to the inherent limitations associated with the machining or tooling process. As a result, the requirement of use of metallic materials which are machined into the desired form, place severe limitations on heat sink design particular when it is known that certain geometries, simply by virtue of their design, would realize better efficiency but are not attainable due to the limitations in machining metallic articles.

It is widely known in the prior art that improving the overall geometry of a heat dissipating article, can greatly enhance the overall performance of the article even if the material is the same. Therefore, the need for improved heat sink geometries necessitated an alternative to the machining of bulk metallic materials. To meet this need, attempts have been made in the prior art to provide molded compositions that include conductive filler material therein to provide the necessary thermal conductivity. The ability to mold a conductive composite enabled the design of more complex part geometries to realize improved performance of the part.

As a result, optimal geometries cannot be achieved with a machined metal heat sink. To compensate for these limitations, active cooling, such as by powered fans, must be employed to achieve the requisite cooling to prevent device failure.

In view of the foregoing, there is a demand for a heat sink assembly that is capable of dissipating heat. There is a demand for a passive heat sink assembly with no moving parts that can provide heat dissipation without the use of active components. In addition, there is a demand for a complete heat sink assembly that can provide greatly enhanced heat dissipation over prior art passive devices with improved heat sink geometry. There is a demand for a heat sink assembly that can provide heat dissipation in a low profile configuration. There is a further demand for a net-shape molded heat sink assembly that is well suited for a wide array of heat generating electronic devices, such as microprocessors and video cards.

SUMMARY OF THE INVENTION

The present invention preserves the advantages of prior art heat dissipation devices, heat sinks and heat spreaders. In addition, it provides new advantages not found in currently available devices and overcomes many disadvantages of such currently available devices.

The invention is generally directed to the novel and unique molded heat sink that is net-shape molded of a thermally conductive polymer composition. The present invention relates to a molded heat sink for dissipating heat from a heat generating source, such as a computer semiconductor chip or electronic components on a computer circuit board, such as a video card.

The molded heat sink of the present invention has many advantages over prior art heat sinks in that it is injection molded from the thermally conductive polymer materials which enables the part to be made in complex geometries. These complex geometries enable the heat sink fin configuration to be optimized to be more efficient thus dissipating more heat. As a result, the molded heat sink is freely convecting through the part which makes it more efficient. The ability to injection mold the heat sink permits the optimal configuration to be realized and achieved. A carbon-carbon matrix plate core is embedded within the molded heat sink to greatly improve the overall thermally conductivity of the heat sink while still enabling the heat sink to be molded into complex geometries. With the present molded heat sink, the heat sink can be designed to what is thermally best while not being limited to the manufacturing and mechanical limitations with prior art processes, such as brazing.

Further, since the molded heat sink is injection molded, there is tremendous flexibility in the arrangement of the all arms, fins and base of the molded heat sink. These various components may be easily optimized to suit the application at hand. For example, the upstanding heat dissipating members may be pins, fins or any other type of configuration.

In accordance with the present invention, the thermally conductive polymer material, which makes up the molded heat sink, can be easily overmolded over the carbon-carbon matrix core plate to further enhance the thermal conductivity of the overall device.

It is therefore an object of the present invention to provide a heat dissipating device that can provide enhanced heat dissipation for a heat generating component or object.

It is an object of the present invention to provide a heat dissipating device that can provide heat dissipation for semiconductor devices on a circuit board, such as a motherboard or video card.

It is a further object of the present invention to provide a heat dissipating device that has no moving parts.

Another object of the present invention is to provide a heat dissipating device that is completely passive and does not consume power.

A further object of the present invention is to provide a heat dissipation device that inexpensive to manufacture.

Another object of the present invention is to provide a heat dissipation device that has a thermal conductivity greater that conventional heat sink designs.

A object of the present invention is to provide a heat sink that is net-shape moldable and has an optimal heat dissipating member configuration.

Yet another objection of the present invention is to provide a molded sink that has a low profile configuration without sacrificing thermal transfer efficiency.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

FIG. 1 is a perspective view of the preferred embodiment of the molded heat sink of the present invention;

FIG. 2 is a cross-sectional view through the line 2—2 of FIG. 1; and

FIG. 3 is a cross-sectional view of an alternative embodiment of the present invention.

DETAILED DESCRIPTION OF THE PREFERRED EMBODIMENT

Referring first to FIGS. 1–3, the net-shape molded heat sink 10 of the present invention is shown. In FIG. 1, a perspective view of the molded heat sink 10 of the present invention is shown while FIG. 2 illustrates a cross-sectional view through the line 2—2 of FIG. 1. The molded heat sink 10 includes a main body section 12 with a number of upwardly extending heat dissipating members 14. The molded heat sink 10 is net-shape molded, such as by injection molding, into a unitary structure from thermally conductive material, such as a thermally conductive polymer composition. The thermally conductive polymer composition includes a base polymer of, for example, a liquid crystal polymer that is loaded with a conductive filler material, such as copper flakes or carbon fiber. Other base materials and conductive fillers may be used and still be within the scope of the present invention. For example, other fillers that may be employed include copper, aluminum, carbon, magnesium and boron nitride. Also, the heat sink 10 of the present invention is net-shape molded which means that after molding it is ready for use and does not require additional machining or tooling to achieve the desire configuration of the part.

A described above, the ability to injection mold a thermally conductive device rather than machine it has many advantages. As can be seen in FIGS. 1 and 2, an fin 14 arrangement, that has optimal heat transfer geometry and properties, can be easily formed as desired. The figures illustrate a fin array but other arrays, such as a pin grid, may be employed and are within the scope of the present invention. The figures illustrate one of many embodiments of the invention where a thermally conductive composition is net-shape molded into a thermally conductive heat sink construction.

As shown in FIG. 2, the installation of the heat sink 10 of the present invention onto a heat generating object 16, such as a microprocessor chip, is shown, by way of example. The microprocessor 16 runs hot and is need of heat dissipation to avoid failure. The main body portion 12 is located in a position to thermally interface with the semiconductor device 20 so that the lower flat surface 12a of the main body portion 12 is in flush thermal communication with the top surface 16a of the semiconductor device 16. The heat sink 10 is fastened to the semiconductor device 16 in ways known in the art, such as by thermally conductive adhesive or fasteners (not shown). Other different types of fasteners and connection methods may be employed for this purpose, such as spring clips.

It should be understood that the application shown in FIGS. 1 and 2 is merely an example of the many different applications of the present invention and is for illustration purposes only. The main body portion 12 is shown to be positioned directly over the semiconductor device 16 to be cooled; however, multiple semiconductor devices 16 of different sizes, configurations and layout may be cooled by a modified embodiment in accordance with the present invention.

Still referring to FIGS. 1 and 2, an carbon-carbon matrix core plate 18 is completely embedded, preferably, in the main body portion 12 of the heat sink to further enhance thermal transfer across the main body portion 12 to the fins 14 emanating upwardly therefrom and out through the fins 14. The core plate 18 is preferably made of a carbon-carbon matrix material which is highly thermally conductive with a thermal conductivity as high as 100 W/m° K or much higher depending on the composition and manufacturing process of the core plate 18.

In a heat sink 100, an alternative embodiment shown in FIG. 3, the core plate 102 of carbon-carbon matrix material is partially embedded within the main body portion 104 of the device 100. The bottom surface 102a of the core plate 102 is in direct contact with the top surface 106a of heat generating object 106. In certain applications, direct contact of the core plate 102 with the heat generating object 106 may be more desirable than the complete embedding of the core plate 18 as in the heat sink 10 of the preferred embodiment.

In both the preferred embodiment of FIGS. 1 and 2 and the alternative embodiment of FIG. 3, the core plate 18, 102 of carbon-carbon matrix material is typically manufacturing using a process similar to paper making where layers of carbon fiber are laid and laminated to form a highly thermally conductively block of material. However, there is little flexibility in the forming and shaping of this block of material. It can be machined to size but intricate geometries are not possible with this monolith. As a result, mating this block to a heat generating surface is difficult and cumbersome. The present invention incorporates this highly thermally conductive block into a net shape molded heat sink assembly that can be easily formed into the desirable configuration and interfaced with a heat generating object by use of a thermally conductive plastic composition that is filled with a thermally conductive filler material. The resultant assembly takes advantages of the highly thermally conductive properties of the carbon core plate 18 and the flexibility of configuration of thermally conductive filled polymer molding material to form a highly conductive heat sink assembly that can cool a wide range of heat generating devices.

In accordance with the present invention, a net-shape molded heat sink is disclosed that is easy and inexpensive to manufacture and provides thermal transfer that is superior to prior art metal machined heat sinks by optimization of the geometry of the device.

It would be appreciated by those skilled in the art that various changes and modifications can be made to the illustrated embodiments without departing from the spirit of the present invention. All such modifications and changes are intended to be covered by the appended claims.

What is claimed is:

1. A method of forming a net-shape molded heat sink, comprising:

providing a core plate of carbon-carbon matrix material having an outer surface with a first portion and section portion;

injection overmolding a thermally conductive main body, having a top surface and a bottom interface surface and being made of a thermoplastic polymer composition molded with thermally conductive filler material, about the core plate of carbon-carbon matrix material thereby covering a first portion of the outer surface of the core plate and leaving the second portion exposed; and simultaneously forming a plurality of thermally conductive fins with said main body during injection molding the thermally conductive main body about the core plate of carbon-carbon matrix material, said fins integrally connected to and emanating from said top surface and being made of said thermoplastic polymer composition loaded with thermally conductive filler material.

2. A method of forming a net-shape molded heat sink, comprising:

providing a core plate of carbon-carbon matrix material having an outer surface;

injection overmolding a thermally conductive main body, having a top surface and a bottom interface surface and being made of a thermoplastic polymer composition molded with thermally conductive filler material, about the core plate of carbon-carbon matrix material thereby completely covering the outer surface of the core plate and leaving the second portion exposed; and simultaneously forming a plurality of thermally conductive fins with said main body during injection molding the thermally conductive main body about the core plate of carbon-carbon matrix material, said fins integrally connected to and emanating from said top surface and being made of said thermoplastic polymer composition loaded with thermally conductive filler material.

* * * * *